(12) United States Patent
Krolak et al.

(10) Patent No.: US 6,198,316 B1
(45) Date of Patent: Mar. 6, 2001

(54) CMOS OFF-CHIP DRIVER CIRCUIT

(75) Inventors: David John Krolak, Dodge Center; Terrance Wayne Kueper, Rochester, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/397,249

(22) Filed: Sep. 16, 1999

(51) Int. Cl.[7] .............................. H03B 1/00; H03K 3/00

(52) U.S. Cl. ...................... 327/112; 327/534; 327/537; 326/17; 326/81

(58) Field of Search .................. 326/83, 86, 87, 326/17, 27, 57, 26; 327/108–112, 534, 537, 170, 379, 389, 391

(56) References Cited

U.S. PATENT DOCUMENTS

| | | | |
|---|---|---|---|
| 5,151,619 | | 9/1992 | Austin et al. ........................... 326/86 |
| 5,451,889 | * | 9/1995 | Heim et al. ........................... 327/534 |
| 5,635,861 | | 6/1997 | Chan et al. ........................... 326/81 |
| 5,719,525 | * | 2/1998 | Khoury ................................. 327/537 |
| 5,825,206 | * | 10/1998 | Krishnamurthy et al. ............. 326/87 |
| 5,892,377 | * | 4/1999 | Johnston et al. ...................... 327/108 |
| 5,933,027 | * | 8/1999 | Morris et al. .......................... 326/83 |
| 5,973,511 | * | 10/1999 | Hsia et al. .............................. 326/86 |
| 6,130,563 | * | 10/2000 | Pilling et al. .......................... 327/112 |

* cited by examiner

*Primary Examiner*—Terry D. Cunningham
*Assistant Examiner*—Long Nguyen
(74) *Attorney, Agent, or Firm*—Felsman, Bradley, Vaden, Gunter & Dillon

(57) ABSTRACT

An improved off-chip driver circuit is disclosed which will properly transition from an active mode to a high impedance mode. The circuit includes first and second input nodes for receiving a first and second input signal respectively. An input composite transmission gate including a p-channel transistor in parallel with an n-channel transistor to receive the first input signal is provided in the circuit. A push-pull circuit is also included which includes the pull-up transistor disposed between a voltage supply and an output node and a first pull-down transistor disposed between ground and the output node. The pull-up transistor has a gate electrode for receiving the first input signal provided by the input composite transmission gate. The first pull-down transistor has a gate electrode for receiving the second input signal. A control transistor is included and is coupled between the gate electrode of the pull-up transistor and the output node. The control transistor has a gate electrode connected to a first point of reference potential. An auxiliary transistor is provided coupled between the first input node and a gate electrode of the p-channel transistor for establishing and maintaining a voltage at the gate electrode of the p-channel transistor during a transition of the circuit from an active mode to a high impedance mode sufficient to provide a proper transition from the active mode to the high impedance mode. A biasing transistor is also provided having a gate electrode directly connected to the output node and coupled to the voltage supply for biasing an N-well in which the pull-up transistor, the control transistor, and the auxiliary transistor are situated.

12 Claims, 2 Drawing Sheets

CMOS OFF-CHIP DRIVER CIRCUIT

BACKGROUND OF THE INVENTION

1. Field of the Invention:

The present invention relates in general to off-chip driver circuits, and, in particular, to an improved CMOS off-chip driver circuit. Still more particularly, the present invention relates to an improved CMOS off-chip driver circuit designed for operation in a lower supply voltage environment than the circuit to which the output of the off-chip driver circuit is connected.

2. Description of the Related Art:

Reduced scaling or shrinking of the geometries of devices used in integrated semiconductor circuit technology for forming denser circuits has required voltage supply sources to provide lower voltages than the heretofore generally accepted standard supply voltage of 5 volts so as to avoid a voltage breakdown in the smaller devices. During the transition from 5 volt supplies to the lower voltage supplies of 3.3 to 3.6 volts, a mix of circuits is being utilized wherein some of the circuits have been designed for use with standard 5 volt supplies while other circuits have been designed for use with the lower 3.3 to 3.6 volt supplies. In general, the geometries of memory circuits are reduced at a faster rate than are the geometries of logic circuits which are coupled to the memory circuits. In particular, CMOS random access memories are currently being designed in the 3.3 to 3.6 voltage supply technology, whereas logic circuits, such as those of transistor—transistor logic (TTL) type, which receive the output or data from the memories, are still being designed in a 5 volt supply technology.

Off-chip driver circuits are commonly used to allow such integrated circuits operating at different power supply voltage levels to communicate with each other. Problems encountered by output drivers and addressed by various prior art circuits have included: excessive voltage stress on thin oxide layers of some of the driver devices, and undesirable current leakage paths causing high power dissipation, and at times, CMOS latchup problems.

One such prior art driver circuit is taught by U.S. Pat. No. 5,151,619, of common assignee, entitled "CMOS Off Chip Driver Circuit" which is incorporated herein by reference. The schematic of the '619 circuit is depicted at FIG. 1. The prior art circuit operates in an active (driving) mode or a high-impedance (receiving) mode. In the active driving mode, initiated by causing both inputs to have the same polarity (i.e. both high or both low), the circuit drives either a CMOS low (0 V) to a CMOS high output voltage transition or a high to low output voltage transition. In the high-impedance mode, initiated by causing node IN' to be low while node IN is high, the driver looks like a high impedance to the next circuit stage which is normally powered by a higher voltage supply (i.e. 5 V). The thrust of the prior art circuit is to protect the transistors within the driver from high oxide gate stress and, when in high impedance mode, to prevent leakage current from flowing from the higher supply voltage (5 V) into Vdd (3.3 to 3.6 V).

The problem with the prior art driver of '619 occurs when it transitions from a high output voltage to the high-impedance state. In order to output a HIGH voltage output Vout, both inputs IN and IN' are LOW. In order to be in the high-impedance state, input IN' remains LOW while input IN transitions from LOW to HIGH so as to turn off pull-up transistor 12. However, initially, transmission of the signal is through transistors 24 and 26 to pull-up node 22. The gate of transistor 12 is hampered because p-channel transistor 26 turns off almost immediately. The n-channel transistor 24 may shut off before it drives node 22 high enough to fully shut off pull-up transistor 12. Transistors 24 and 26 do have some leakage in this state and will over a long period of time eventually pull node 22 high enough to shut off transistor 12. Before transistors 24 and 26 are able to shut off transistor 12, some other driver attached to node Vout may attempt to pull Vout low. When this happens, transistor 12 will resist the attempt by sourcing current into node Vout until the other driver is able to pull Vout low enough to turn device 26 on which then drives node 22 high, thus shutting off transistor 12. On a shared bus, several drivers can be in this partially-on condition with the combined effect altering the transition time of the net sufficiently to cause a failure.

Therefore a need exists for an improved off-chip driver circuit which properly transitions from an active mode to a high-impedance mode.

SUMMARY OF THE INVENTION

An improved off-chip driver circuit is disclosed which will properly transition from an active mode to a high impedance mode. The circuit includes first and second input nodes for receiving a first and second input signal respectively. An input transmission gate including a p-channel transistor in parallel with an n-channel transistor to receive the first input signal is provided in the circuit. A push-pull circuit is also included which comprises the pull-up transistor disposed between a voltage supply and an output node and a first pull-down transistor disposed between ground and the output node. The pull-up transistor has a gate electrode for receiving the first input signal provided by the input transmission gate. The first pull-down transistor has a gate electrode for receiving the second input signal. A control transistor is included and is coupled between the gate electrode of the pull-up transistor and the output node. The control transistor has a gate electrode connected to a first point of reference potential. An auxiliary transistor provides coupling between the first input node and a gate electrode of the p-channel transistor for establishing and maintaining a voltage at the gate electrode of the p-channel transistor during a transition of the circuit from an active mode to a high impedance mode sufficient to provide a proper transition from the active mode to the high impedance mode. A biasing transistor is also provided having a gate electrode directly connected to the output node and coupled to the voltage supply for biasing an N-well in which the pull-up transistor, the control transistor, and the auxiliary transistor are situated.

The above as well as additional objectives, features, and advantages of the present invention will become apparent in the following detailed written description.

BRIEF DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

DETAILED DESCRIPTION OF A PREFERRED EMBODIMENT

Figure 1:
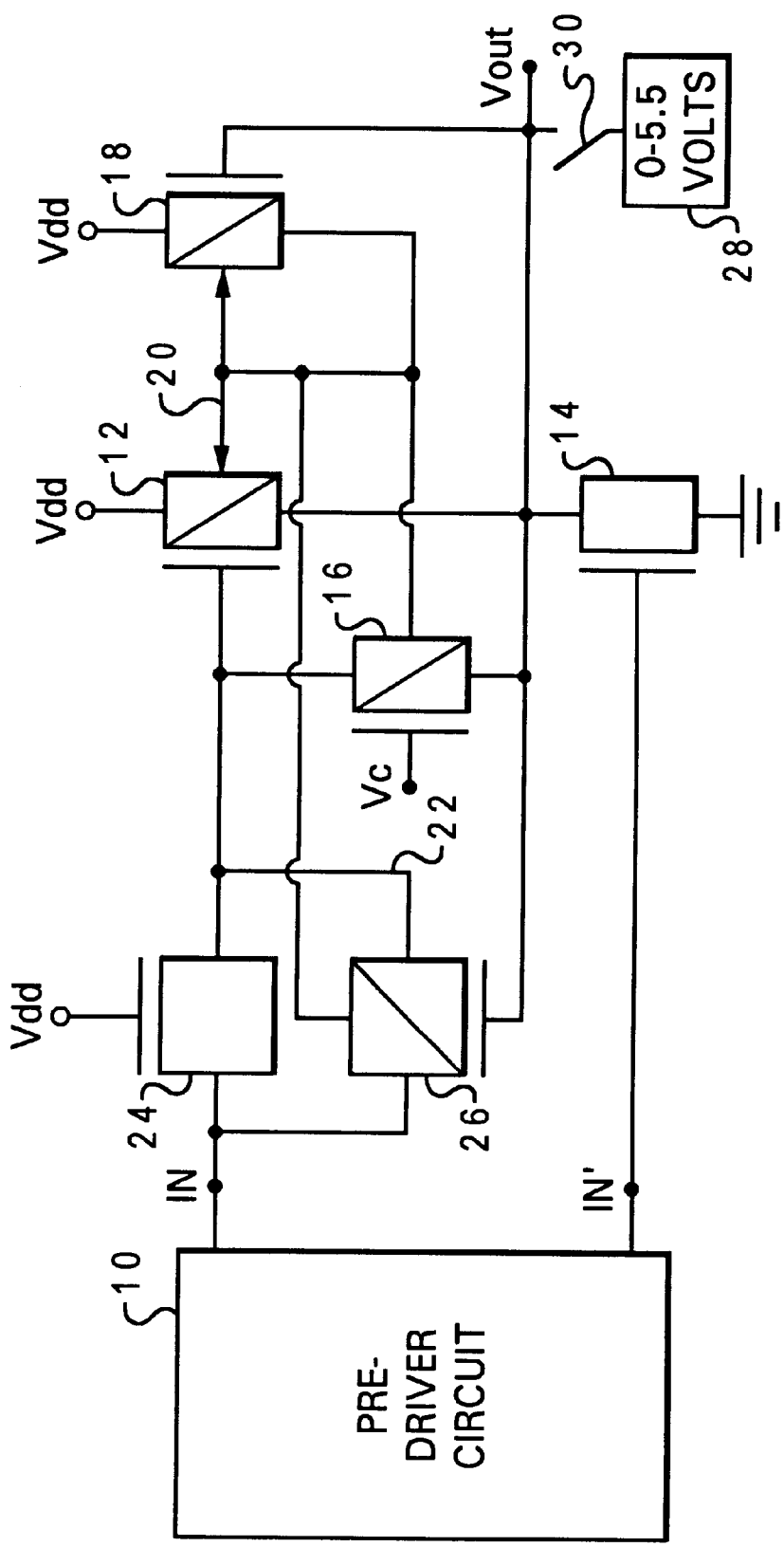
FIG. 1 illustrates a schematic diagram of an off-chip driver circuit in accordance with the prior art.
Figure 2:
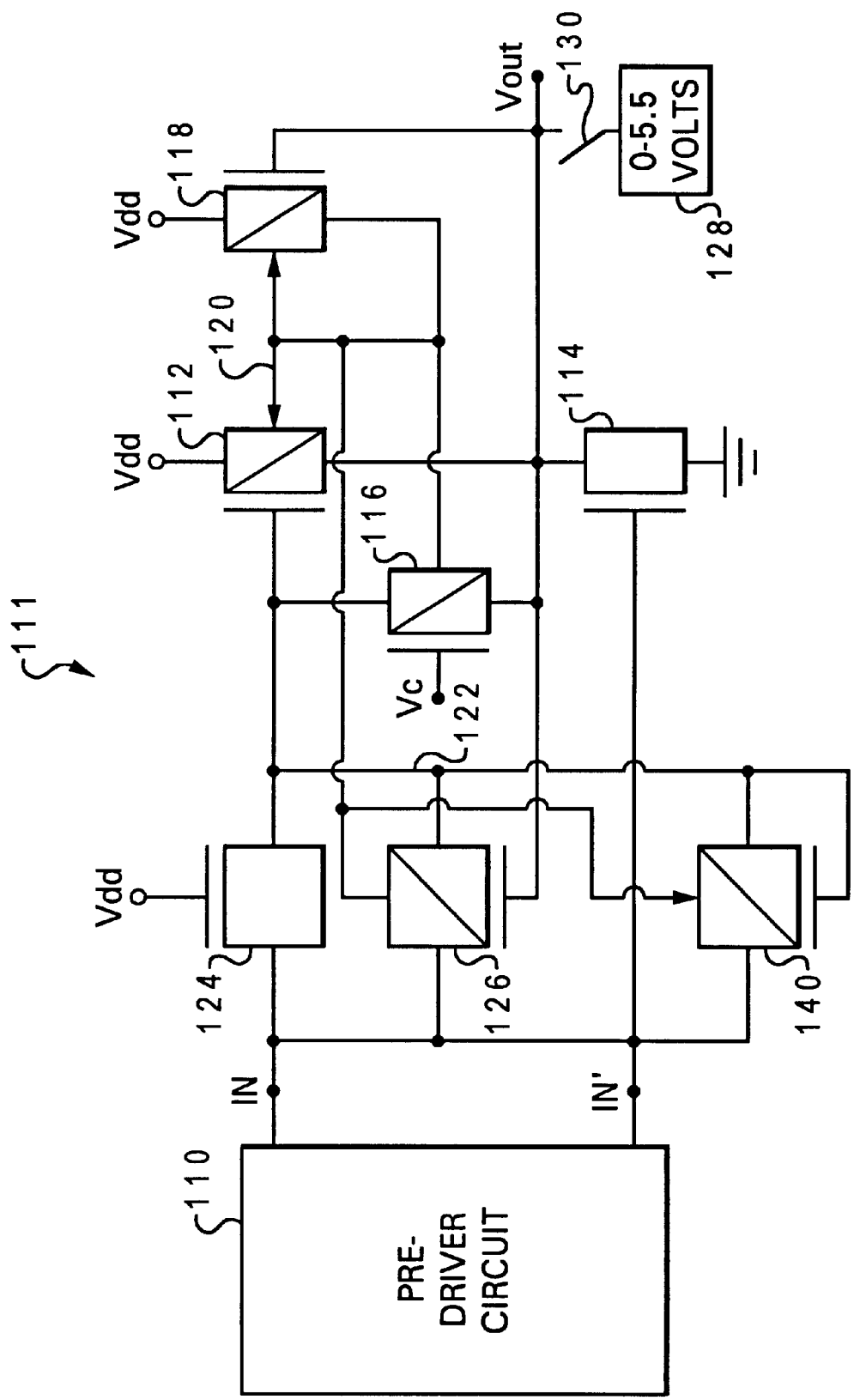
FIG. 2 depicts a schematic diagram of an improved off-chip driver circuit in accordance with the method and system of the present invention.

FIG. 2 depicts a schematic diagram of an improved off-chip driver circuit 111 in accordance with the method and system of the present invention. The off-chip driver circuit 111 of FIG. 2 is coupled to a pre-driver circuit 110 which may be any suitable, known pre-driver circuit. The off-chip driver circuit 111, being made in the CMOS technology, has its p-channel field effect transistors indicated by a rectangle with a diagonal line formed therein and a gate electrode arranged adjacent thereto, and its n-channel field effect transistors indicated by a rectangle without a diagonal line and a gate electrode arranged adjacent thereto.

The circuit 111 includes a first and second input terminals IN and IN', respectively, connected to the pre-driver circuit 110, and a p-channel field effect transistor 112 acting as a pull up transistor and an n-channel field effect transistor 114 acting as a pull down transistor serially arranged between a first voltage source Vdd having a supply voltage of a given magnitude, such as 3.6 volts, and a point of reference potential, such as ground. The common point between the serially arranged transistors 112 and 114 forms a data output terminal Vout. The gate electrode of n-channel transistor 114 is connected to the second input terminal IN'. A p-channel field effect transistor 116 acting as a control transistor is connected between the output terminal Vout and the gate electrode of p-channel 112 with its gate electrode connected to a reference voltage Vc which has a magnitude preferably equal to or less than the supply voltage of the first voltage source Vdd and equal to or greater than the supply voltage of the first voltage source Vdd minus the threshold voltage Vt of p-channel transistor 112. It can be seen that it is convenient to have the voltage Vc be made equal to that of the first voltage source Vdd. A p-channel field effect transistor 118 acting as an N-well bias transistor is connected between the first voltage source Vdd and a common N-well 120 with its gate electrode being connected to the data output terminal Vout. The p-channel pull up transistor 112, control transistor 116, N-well bias transistor 118, and an auxiliary transistor 140 are all disposed in the common N-well 120.

An composite transmission gate is connected between the first input terminal IN and the gate electrode of the pull up transistor 112. The composite transmission gate includes an n-channel field effect transistor 124 having its gate electrode connected to a point of reference potential, preferably the supply voltage of the first voltage source Vdd, and a p-channel field effect transistor 126 connected in parallel with the n-channel transistor 124 having its gate electrode connected to the data output terminal Vout.

An external circuit or system, which may be a transistor-transistor logic (TTL) circuit having a second voltage source, sometimes known as VH, with a supply voltage of about 5 volts, indicated by block 128, is selectively connectable by any appropriate means, such as switching means 130, to the data output terminal Vout. The external circuit or system 128 is generally formed on a separate semiconductor chip and may have voltages which range from about 0 to 5.5 volts.

In accordance with an important feature of the present invention, auxiliary transistor 140, preferably a p-channel field effect transistor, is disposed in common N-well 120 and has its gate electrode and drain coupled to the gate electrode of p-channel transistor 112 and its source coupled to the IN node of pre-driver circuit 110. Auxiliary transistor 140 is utilized to ensure that the gate electrode of transistor 112 reaches a sufficiently high voltage to be able to turn transistor 112 off during a transition of the off-chip driver circuit 111 from an active state where input nodes IN and IN' were both LOW to a high-impedance state where the input node IN is driven HIGH while the input node IN' remains LOW.

In the operation of the CMOS off-chip driver circuit of the present invention, to apply binary digit information, i.e. a 0 or a 1, which is indicated by 0 or 3.6 volts, respectively, to the data output terminal Vout, voltage 0 or 3.6 volts are supplied by the pre-driver circuit 110 to the input terminals IN and IN' to control the pull up and pull its down transistors 112 and 114, respectively. As is known, if the voltage at the gate electrode of the p-channel transistor 112 is low, i.e. at 0 volts, and the voltage at the gate electrode of the n-channel transistor 114 is also low, output terminal Vout will be at a high voltage of 3.6 volts. If the voltage at the gate electrode of the p-channel transistor 112 is high, i.e. at 3.6 volts, and the voltage at the gate electrode of the n-channel transistor 114 is also high, output terminal Vout will be at a low voltage of approximately 0 volts.

If the voltage at the gate electrode of the p-channel transistor 112 is high, i.e. at 3.6 volts, and the voltage at the gate electrode of the n-channel transistor 114 is low, i.e. at 0 volts, then the output is in a high impedance state and the driver circuit is said to be disabled. In this condition, voltages from the external circuit 128 which may have a magnitude of from 0 to 5.5 volts can be applied to the output terminal Vout with the closing of the switching means 130.

With the driver circuit disabled, when the voltage applied to the output terminal Vout rises to a threshold voltage above the voltage Vc, the p-channel transistor 116 turns on allowing the voltage at the gate electrode of the first p-channel transistor 112 to rise to the voltage at the output terminal Vout. Forward biasing of the source-to-N-well junction of the p-channel transistor 116 causes current to flow into the N-well 120 and the floating N-well voltage consequently rises to the voltage at the output terminal Vout minus the base-emitter drop in the parasitic pnp transistor which is formed in the N-well 120. The p-channel transistor 112, which is also tied to the floating substrate or N-well 120, will now have a positive potential between its gate electrode and source, maintaining transistor 112 in the off condition to prevent current flow into the voltage source Vdd. Also, since the voltage at the gate electrode of the p-channel transistor 112 is greater than the supply voltage of the voltage source Vdd minus a threshold voltage of the n-channel transistor 124, transistor 124 turns off to prevent current flow into the pre-driver circuit 110. Transistor 140 also will have a zero potential between its gate and source node 122, and will thus be off, preventing current flow into pre-driver circuit 110. Of course, since the voltage at the output terminal Vout is high, the p-channel transistor 126 of the transmission gate 122 will also be turned off.

When circuit 111 transitions from an active mode where Vout was HIGH to a high-impedance mode, transistor 140 is utilized to ensure that transistor 112 completely shuts off. When transistor 126 is off because Vout is HIGH, transistor 140 will now still be on, thus allowing node 122 to reach a higher voltage than in the prior art. Eventually the voltage at node 122 will reach the point where transistor 140 also shuts off. However, because the voltage threshold for transistor 140 closely tracks that for transistor 112, transistor 112 has also shut off.

Those skilled in the art will recognize that transistor 140 is sufficient to hold off transistor 112 rendering transistor 126 not strictly necessary for function and leakage. However, it is deemed to be poor practice to hold a device's gate at the device's threshold when there is a high drain-source voltage across the device because hot carrier degradation may occur. For a process where hot carrier degradation is not a concern, transistor 126 may be eliminated from circuit 111.

While a preferred embodiment has been particularly shown and described, it will be understood by those skilled in the art that various changes in form and detail may be made therein without departing from the spirit and scope of the present invention.

What is claimed is:

1. An improved off-chip driver circuit, comprising:
   a first and second input node for receiving a first and second input signal respectively;
   an input composite transmission gate including a p-channel transistor in parallel with an n-channel transistor to receive the first input signal;
   a push-pull circuit comprising a pull-up transistor disposed between a voltage supply and an output node and a pull-down transistor disposed between ground and the output node, the pull-up transistor having a gate electrode for receiving the first input signal provided by the input composite transmission gate, the pull-down transistor having a gate electrode for receiving the second input signal;
   a control transistor coupled between the gate electrode of the pull-up transistor and the output node and having a gate electrode connected to a first point of reference potential;
   an auxiliary transistor having a gate, a drain, and a source, said source of said auxiliary transistor being directly connected to said first input node and both said gate and drain of said auxiliary transistor being directly connected to a gate electrode of said pull-up transistor for quickly establishing and maintaining a voltage at said gate electrode of said pull-up transistor after a transition of said circuit from a first state to a second state sufficient to provide a proper transition from said first state to said second state; and
   a biasing transistor having a gate electrode directly connected to the output node and coupled to the voltage supply for biasing an N-well in which the pull-up transistor, the control transistor, and the auxiliary transistor are situated.

2. The circuit according to claim 1, wherein said auxiliary transistor is a p-channel field effect transistor.

3. The circuit according to claim 2, said p-channel field effect auxiliary transistor for maintaining said voltage at said gate electrode of said pull-up transistor after a transition of said circuit from an active state to a high impedance state to provide a proper transition from said first state to said second state.

4. The circuit according to claim 3, said p-channel field effect auxiliary transistor maintaining said voltage at said gate electrode of said pull-up transistor to turn said pull-up transistor off after said circuit transitions from said active state to said high-impedance state.

5. The circuit according to claim 4, said p-channel field effect auxiliary transistor maintaining said sufficient voltage at said gate electrode of said pull-up transistor to turn said pull-up transistor off when said circuit transitions from said first and second input nodes both being a LOW logical level to said first input node being a HIGH logical level and said second input node remaining a LOW logical level.

6. The circuit according to claim 5, wherein said fixed point of reference potential is said supply voltage.

7. The circuit according to claim 6, further comprising:
   a semiconductor substrate including an N-well supporting said transistors; and
   means including a second p-channel field effect biasing transistor for biasing said N-well having a gate electrode coupled to said output terminal.

8. The circuit according to claim 7, wherein said pull up transistor and said control transistor are p-channel field effect transistors.

9. A method in an off-chip driver circuit for properly transitioning said circuit from an active mode to a high-impedance mode, said method comprising the steps of:
   receiving a first input signal utilizing a first input node in said circuit;
   receiving a second input signal utilizing a second input node in said circuit;
   inputting said first input signal into an input composite transmission gate coupled to said first input node, said composite transmission gate including a p-channel transistor in parallel with an n-channel transistor;
   establishing a push-pull circuit comprising a pull-up transistor disposed between a voltage supply and an output node and a pull-down transistor disposed between ground and the output node;
   inputting said first input signal provided by the input composite transmission gate into a gate electrode of the pull-up transistor;
   inputting the second input signal into a gate electrode of the pull-down transistor;
   establishing a control transistor coupled between the gate electrode of the pull-up transistor and the output node and having a gate electrode connected to a first point of reference potential;
   establishing an auxiliary transistor having a gate, a drain, and a source, said source of said auxiliary transistor being directly connected to said first input node and both said gate and said drain of said auxiliary transistor being directly connected to a gate electrode of said pull-up transistor;
   quickly establishing and maintaining a voltage at said gate electrode of said pull-up transistor after a transition of said circuit from a first state to a second state utilizing said auxiliary transistor sufficient to provide a proper transition from said first state to said second state;
   establishing a biasing transistor having a gate electrode directly connected to the output node and coupled to the voltage supply; and
   biasing an N-well in which the pull-up transistor, the control transistor, and the auxiliary transistor are situated utilizing said biasing transistor.

10. The method according to claim 9, wherein the step of quickly establishing and maintaining said voltage at said gate electrode of said pull-up transistor after a transition of said circuit from a first state to a second state utilizing said auxiliary transistor further comprises the step of quickly establishing and maintaining said voltage at said gate electrode of said pull-up transistor after a transition of said circuit from an active state to a high-impedance state utilizing said auxiliary transistor.

11. The method according to claim 10, further comprising the step of turning said pull-up transistor off utilizing said auxiliary transistor in response to said circuit transitioning from said active state to said high-impedance state.

12. The method according to claim 11, wherein the step of turning said pull-up transistor off utilizing said auxiliary transistor in response to said circuit transitioning from said active state to said high-impedance state further comprises the step of turning said pull-up transistor off utilizing said auxiliary transistor in response to said first input signal transitioning from a low logical level to a high logical level while said second input signal remains a low logical level.

* * * * *